United States Patent
Fawaz et al.

(10) Patent No.: US 9,995,594 B2
(45) Date of Patent: Jun. 12, 2018

(54) ELECTRIC LOAD LABELING POST ITEMIZATION BASED ON ANALYSIS OF POWER MEASUREMENTS AT A SINGLE POINT

(71) Applicants: Siemens Corporation, Iselin, NJ (US); Siemens Industry, Inc., Alpharetta, GA (US)

(72) Inventors: Ayman Fawaz, Berkeley, NJ (US); Ned Cox, Gray, TN (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 293 days.

(21) Appl. No.: 14/759,295

(22) PCT Filed: Jan. 8, 2014

(86) PCT No.: PCT/US2014/010642
§ 371 (c)(1),
(2) Date: Jul. 6, 2015

(87) PCT Pub. No.: WO2014/110109
PCT Pub. Date: Jul. 17, 2014

(65) Prior Publication Data
US 2015/0354982 A1 Dec. 10, 2015

Related U.S. Application Data

(60) Provisional application No. 61/750,397, filed on Jan. 9, 2013.

(51) Int. Cl.
*G01B 3/18* (2006.01)
*G01D 4/00* (2006.01)
*G01R 21/133* (2006.01)

(52) U.S. Cl.
CPC ......... *G01D 4/002* (2013.01); *G01R 21/1333* (2013.01); *Y02B 90/241* (2013.01); *Y04S 20/32* (2013.01); *Y04S 20/38* (2013.01)

(58) Field of Classification Search
None
See application file for complete search history.

(56) References Cited

U.S. PATENT DOCUMENTS

| | | | |
|---|---|---|---|
| 2009/0187499 A1 | 7/2009 | Mulder et al. | |
| 2012/0323393 A1* | 12/2012 | Imhof | G05B 15/02 700/297 |

FOREIGN PATENT DOCUMENTS

| CN | 102435806 A | 5/2012 |
|---|---|---|
| CN | 102448763 A | 5/2012 |

(Continued)

OTHER PUBLICATIONS

Report of Examination dated Jun. 21, 2016; Chinese Patent Application No. 201480004255.3; 11 pages.

(Continued)

*Primary Examiner* — Cory Eskridge

(57) ABSTRACT

A facility is connected to an electricity utility and includes a plurality of control computer controlled devices and a plurality of devices that is uncontrolled by control computers. An operational status of each of the control computer controlled devices is monitored by a server. The facility has a power meter that provides data representing actual power consumption to the server which is connected via a network to the control computer. The server is configured to determine power consumption of each device in the plurality of controlled devices from operational status data and power consumption data.

20 Claims, 5 Drawing Sheets

(56) References Cited

FOREIGN PATENT DOCUMENTS

WO      2011130670  A2    10/2011
WO      2012106709  A2    8/2012

OTHER PUBLICATIONS

PCT International Search Report dated May 16, 2014 corresponding to PCT International Application No. PCT/US2014/010642 filed Jan. 8, 2014 (11 pages).

\* cited by examiner

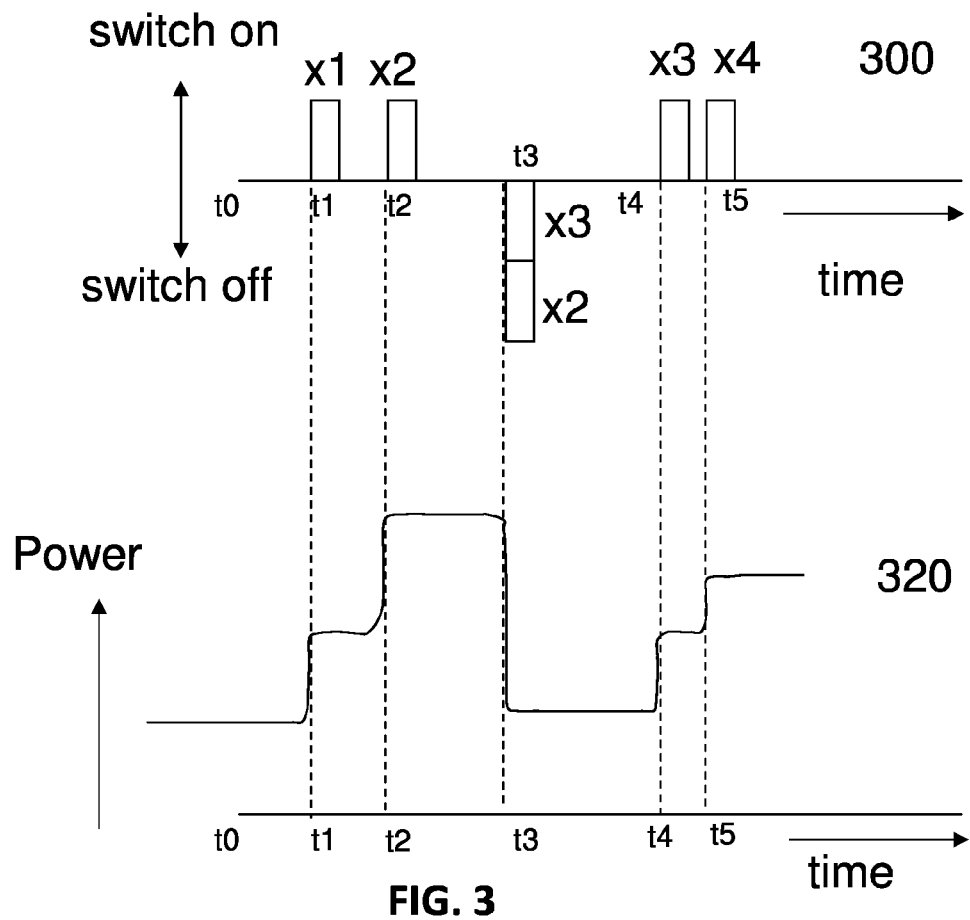

ELECTRIC LOAD LABELING POST ITEMIZATION BASED ON ANALYSIS OF POWER MEASUREMENTS AT A SINGLE POINT

CROSS REFERENCE TO RELATED APPLICATIONS

The present application claims priority to and the benefit of U.S. Provisional Patent Application Ser. No. 61/750,397 filed on Jan. 9, 2013.

TECHNICAL FIELD

The present invention is related to systems and methods for energy management. More in particular it relates to methods and systems to manage energy use by monitoring industrial controls through a communication network.

BACKGROUND

Based on the determined state changes of a process control computer such as a Programmable Logic Controller (PLC), one can identify and characterize individual loads or load clusters that are being turned on and off on a circuit. This is called a load itemization.

To create user awareness on energy consumption, it is important to know the actual physical loads and associate the derived consumption with them. This cannot be achieved through the load itemization mechanism alone, without human intervention or access to additional information.

Accordingly, novel and improved methods and systems are required to automatically determine actual physical loads of equipment and associate the power consumption from status data of a process control computer.

SUMMARY

In accordance with an aspect of the present invention, a system is provided to determine power consumption of PLC controlled devices connected to a power circuit.

In accordance with an aspect of the present invention, a system is provided to determine a power consumption of each of a plurality of devices in a power circuit, comprising a network including a power meter configured to disaggregate a first individual power consumption from a total power consumption in the power circuit, a control computer including at least one control output, configured to control an operational status of a first device in the plurality of devices that is connected to the power circuit, a server connected by the network to the control computer and configured to receive data from the control computer that determines the operational status of the first device, the power meter enabled to transmit data representing the first individual power consumption to the server, and wherein the server is configured to determine a power consumption of the first device by associating the operational status of the first device with the first individual power consumption.

In accordance with yet another aspect of the present invention, a system is provided, wherein each of the plurality of devices is controlled by a Programmable Logic Device (PLC).

In accordance with yet another aspect of the present invention, a system is provided, wherein each PLC is connected to the server by the network.

In accordance with yet another aspect of the present invention, a system is provided, wherein an operational status of each of the devices in the plurality of devices is monitored by the server and a power consumption of each of the devices in the first plurality of devices is determined by the server based on data provided by the power meter.

In accordance with yet another aspect of the present invention, a system is provided, wherein a power consumption by a second plurality of devices in the power circuit changes over time in a random manner.

In accordance with yet another aspect of the present invention, a system is provided, further comprising: the server configured to executing instructions to schedule an activation of the first device by the control computer based on the power consumption of the device.

In accordance with yet another aspect of the present invention, a system is provided, wherein the control computer is a Programmable Logic Controller (PLC).

In accordance with yet another aspect of the present invention, a system is provided, wherein the control computer is a Home Automation Controller (HAC).

In accordance with yet another aspect of the present invention, a system is provided, further comprising a user interface of the server which is configured to interactively assign a power consumption to a second device.

In accordance with yet another aspect of the present invention, a system is provided, wherein the server is configured to instruct a Programmable Logic Controller (PLC) to switch-on a second device to assign a power consumption to the second device based on data generated by the power meter.

In accordance with a further aspect of the present invention, a method is provided for determining a power consumption of each of a plurality of devices in a power circuit, comprising: a power meter in a network disaggregating a first individual power consumption from a total power consumption in the power circuit, a control computer including at least one control output, controlling an operational status of a first device in the plurality of devices that is connected to the power circuit, a server connected by the network to the control computer receiving data from the control computer that determines the operational status of the first device, the power meter transmitting data representing the first individual power consumption to the server and the server determining a power consumption of the first device by associating the operational status of the first device with the first individual power consumption.

In accordance with yet a further aspect of the present invention, a method is provided, wherein each of the plurality of devices is controlled by a Programmable Logic Device (PLC).

In accordance with yet a further aspect of the present invention, a method is provided, wherein each PLC is connected to the server by the network.

In accordance with yet a further aspect of the present invention, a method is provided, wherein an operational status of each of the devices in the plurality of devices is monitored by the server and a power consumption of each of the devices in the first plurality of devices is determined by the server based on data provided by the power meter.

In accordance with yet a further aspect of the present invention, a method is provided, wherein a power consumption by a second plurality of devices in the power circuit changes over time in a random manner.

In accordance with yet a further aspect of the present invention, a method is provided, further comprising: the server executing instructions to schedule an activation of the first device by the control computer based on the power consumption of the device.

In accordance with yet a further aspect of the present invention, a method is provided, wherein the control computer is a Programmable Logic Controller (PLC).

In accordance with yet a further aspect of the present invention, a method is provided, wherein the control computer is a Home Automation Controller (HAC).

In accordance with yet a further aspect of the present invention, a method is provided, further comprising assigning interactively via a user interface of the server a power consumption to a second device.

In accordance with yet a further aspect of the present invention, a method is provided, wherein the server is configured to instruct a Programmable Logic Controller (PLC) to switch-on a second device to assign a power consumption to the second device based on data generated by the power meter.

DRAWINGS

FIG. 3 illustrates graphically a time dependent status change and a change in power consumption in accordance with one or more aspects of the present invention;

FIG. 4 illustrates in a table a change of operational status and change in power consumption of a plurality of devices in accordance with one or more aspects of the present invention;

DESCRIPTION

Figure 1:
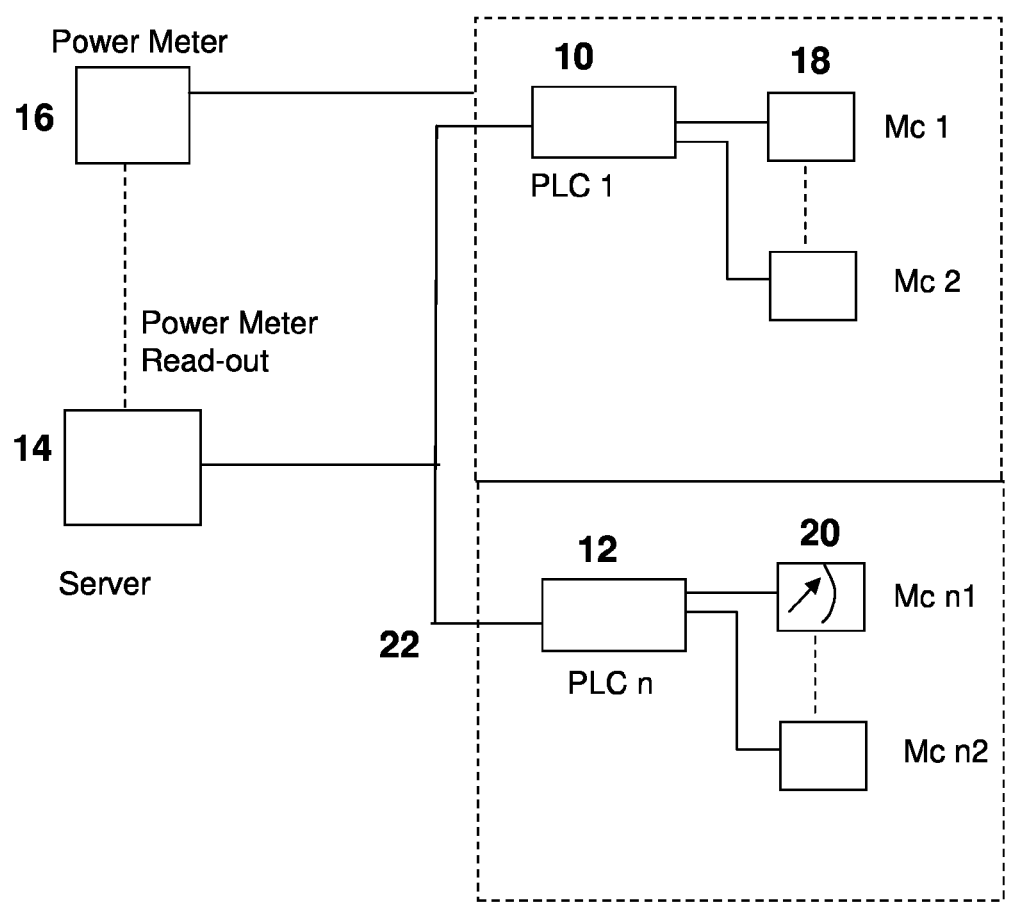
FIGS. 1 and 2 illustrate in diagram a network with control computer controlled devices in accordance with one or more aspects of the present invention.

Programmable Logic Controllers (PLCs) are controllers applied in controlling a process. A PLC is used to monitor input signals from a variety of input points (input sensors) which report events and conditions occurring in a controlled process. For example, a PLC can monitor such input conditions as motor speed, temperature, pressure, volumetric flow and the like or control signals provided by a supervisory computer. A control program is stored in a non-volatile memory within the PLC to instruct the PLC what actions to take upon encountering particular input signals or conditions. In response to these input signals, for instance provided by input sensors, the PLC derives and generates output signals which are transmitted via PLC output points to various output devices, such as actuators and relays, to control the process. For example, the PLC issues output signals to speed up or slow down a conveyer, rotate the arm of a robot, open or close a relay, raise or lower temperature as well as many other possible control functions too numerous to list.

The input and output points referred to above, are typically associated with input modules and output modules, respectively. Input modules and output modules are collectively referred to as I/O modules herein. Those skilled in the art alternatively refer to such I/O modules as I/O cards or I/O boards. These I/O modules are typically pluggable into respective slots located on a backplane board in the PLC. The slots are coupled together by a main bus which couples any I/O modules plugged into the slots to a central processing unit (CPU). The CPU itself can be located on a card which is pluggable into a dedicated slot on the backplane of the PLC.

A PLC as provided herein is linked to at least another device by a communication network, for instance to a server. The server and PLC are configured to collaborate through the network. For instance, a server may provide a signal to an I/O port of a PLC, to start or to stop an operation controlled by the PLC. For instance a first signal provided by a server instigates a ladder logic sequence on the PLC, which controls a process or a machine or a plurality of machines. A second signal by the server may instruct the PLC to stop the ladder logic sequence or program. To prevent undesirable consequences, the second signal may cause a second ladder sequence to be executed by the PLC to disconnect or stop machines in an appropriate order and manner.

PLCs are industrial devices, ruggedized to operate in non-office environments, configured with modular I/O units to switch off or on high voltage devices at defined time intervals based on input signals and in a preset order and programmed with ladder logic as known to one of ordinary skill. The term PLC is reserved herein to indicate the above type of industrial device.

A related class of control devices are microcontrollers, PCs, or other control computers. They may perform some or all of the functions of a PLC, but are for instance not controlled by ladder logic or are run under an operating system that is configured to handle additional applications, rendering the control part sensitive to unwanted interrupts. The term process control computer is used herein as a term covering the wider range of control processors and which includes PLCs.

A process herein in one embodiment of the present invention is any process that requires the on and off switching of a single device by a process control computer. A process herein in another embodiment of the present invention is any process that requires the on and off switching of at least two devices by a process control computer. A process herein in yet another embodiment of the present invention is any process that requires the on and off switching of at least two devices by a process control computer in a pre-defined order.

One manufacturer of PLCs and Process Control Computers is Siemens Corporation, the assignee on the instant disclosure.

Another, recent, type of process control computer is a Home Automation Controller (HAC) which is used to switch on or off lights, heating, air-conditioners, appliances, or any other electrically powered device in a home. Often, a HAC is configured to be operated from a mobile communication device. With an HAC, a consumer can check security of a house, such as a status of locks, doors and windows and status of equipment in the house, including heating and air-conditioning, lighting and appliances. The consumer can modify the status of the appliances and lights, including switching on and off of an apparatus, changing a temperature in at least part of the house and modifying the status of any other apparatus in the house that is controlled by a controllable switch.

An on-off status of a switch can be monitored over a network. Different analysis techniques exist that can identify electric load state changes on an electric circuit based on the measurements over time of the current, voltage, power factor etc. at a single point on the circuit. Based on the determined state changes, additional analysis techniques can identify and characterize (by power consumption) individual loads or load clusters that are being turned on and off on the circuit. Such capability is referred to as a load itemization.

To create consumer or user awareness however, it is important to know the actual physical loads and associate the derived consumption with them. This cannot be achieved through the load itemization mechanism without human intervention or access to additional information.

In a factory, PLCs are used in a factory to control equipment. In accordance with an aspect of the present invention the outputs of all PLCs, which are connected to a network, are read and are provided to a processor, for instance to a server. The outputs are identified to belong to a particular device or group of devices and the meaning of an output if it switches a device on or off is also identified. In one embodiment of the present invention a PLC provides a range of possible values on an output, for instance coded in a 16 bit word.

A digital representation of a PLC output is generally also available for monitoring purposes. For instance, networked PLCs are monitored by a server as part of a Supervisory Control & Data Acquisition (SCADA) system. In such and other monitoring or supervisory systems the state of an output of a PLC or other controller is made available over a network to the server. A simple look-up table on the server provides information which machine or groups of machines or part of a machine is active.

A configuration of a network providing PLC data to a server is illustrated in FIG. 1. It illustrates PLCs 10 and 12, each controlling at least one apparatus. PLC 10 controls an on/off device 18. PLC 12 controls a variable power consuming device 20. PLC 20 provides a variable signal with at least one intermediate state between on and off to set the power consumption of device 20. For instance, device 20 may be a motor that has to run at different speeds depending on certain conditions.

A network 22, which may include a wireless network, connects the PLCs to a server 14. The server 14 is configured to receive data, such as PLC status, from PLCs and other control computers and is also configured to provide instructions to a PLC and other control computers. Also provided is a power meter 16, which determines and records power, preferably electric power that is consumed by equipment that is monitored by the server 14. Meter read-out data is provided by the meter 16 to the server 14 over the network 22.

In accordance with an aspect of the present invention a digital electricity meter measures total consumed power almost instantaneously, at least every 10 seconds, preferably at least every second and more preferably several times per second. The digital electricity meter provides status information, including power consumption data, to the server.

Figure 2:
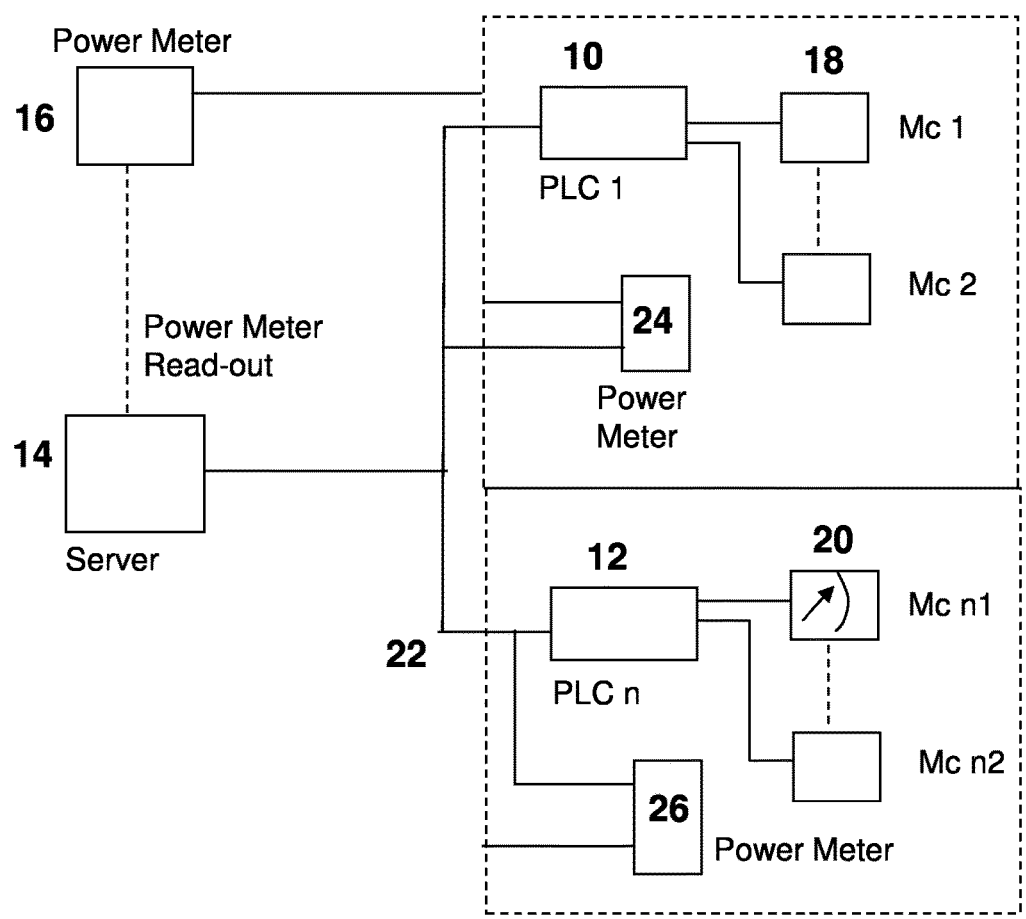

In one embodiment of the current invention, one power meter is provided to monitor the total power consumption of the devices controlled by the PLCs. In another embodiment of the present invention, an individual power group that is part of the power network monitored via the server 14, has its own power meter. This is illustrated in FIG. 2. Herein group meters 24 and 26 are provided, which record the power consumption of devices, controlled by PLCs or control computers 10 and 12, respectively. As shown, the power meters are connected to the power lines that provide the power and to the network 22 that connects to the server. It should be clear that power signals and data signals are separated. In one embodiment of the present invention, the actual electricity lines are also used for data transmission, by using appropriate equipment as is known in the art.

In accordance with an aspect of the present invention, devices under control of a PLC or other control computer are monitored and associated with a power consumption. In accordance with a further aspect of the present invention, a specific power consumption of a device is determined from the on/off behavior of the related PLC or control computer and by monitoring the overall power consumption in a facility by a power meter.

In a facility, not all devices, including lighting, heating, computers and the like, are controlled by a PLC or a control computer. Often, devices are manually controlled by a user. Accordingly, overall power consumption recorded by a power meter, may indicate an increase or decrease in power consumption, without the server receiving data from a PLC or control computer that it is being switched on or off. In general, this indicates that a device that is not controlled by a PLC or control computer is switched on or off. There is no absolute way to determine which non-controlled devices are switched on or off. However, reasonable assumptions can be made. For instance, a pattern may be detected wherein in the morning in the facility, when personnel arrives and computers and lights are switched on. A reasonable average power level for non-controlled equipment may be established by the server, especially when the same uncontrolled amount of power is being switched off during the late afternoon going into the evening. Over time, relevant average power of an aggregate of uncontrolled devices may be determined for different periods during the day and depending on a time of year.

In some cases, controlled machines will be started (or switched off) around the same time when arriving employees start computers and the like. This distorts real-time determination of the consumed power as it is unclear where the power should be attributed to. The switching off of controlled devices also provides information about the power consumption of the device as it will indicate how much less power is consumed. Assuming that switching on and off of PLC or control computer controlled devices is not real-time synchronized with switching on and off uncontrolled devices, then the detection of a minimum amount of power over time that is switched on or off associated with a single switch in a PLC may be considered to represent the load of a device.

A PLC may control multiple and often related devices. For instance a motor of a lift and the motor of a transport band may be synchronized and start and switch off at the same time. In that case two or more devices may be considered a single device with a corresponding power consumption.

In a further embodiment of the present invention, a PLC or control computer program may present or generate a time sequence chart or time sequence file that shows how PLC output signals are generated over time and how output signals are interrelated.

In accordance with an aspect of the present invention a digital electricity meter measures total consumed power almost instantaneously, at least every 10 seconds, preferably at least every second and more preferably several times per second. The digital electricity meter provides status information, including power consumption data, to the server.

Based on output signals of the PLCs or control computers and equipment identification data, a plot is derived and displayed showing which equipment is being turned on and off over time. This is shown in FIG. 3 plot 300. In accordance with a further aspect of the present invention, this plot is overlaid with an electric loads state change in a time plot 320 as shown in FIG. 3 time plot. The plots can be used for visual representation. FIG. 3 further illustrates an asynchronous character of the switching of devices.

For illustrative purposes the curve 320 shows total power consumption as well as change in power consumption. Only a change in power consumption is required. In one embodiment of the present invention a power meter 16, which may be a smart power meter that provided disaggregated data, provides times series representing change in power consumption.

In accordance with a further aspect of the present invention, the switches, power consumption and the differential power consumption are determined and organized in a retrievable data format, for instance in an array, as illustrated in array 400 in FIG. 4.

In one embodiment of the present invention, power consumption measurements are performed on a regular basis, for instance every 0.1 of a second, or every 0.5 second, or every second or every 5 seconds or every 15 seconds. In another embodiment of the present invention, power consumption measurement is performed at least every time a PLC switches on or off a device.

FIGS. 3 and 4 illustrate the power consumption measurement on regular intervals, coinciding with switching on or off of devices by a PLC or control computer. The figures are a simplification as not to clutter the schematic representation of the matching of power consumption with certain devices. It becomes feasible to associate the power consumption characteristics of the individual loads or load clusters with the individual pieces of equipment or equipment clusters. This is further illustrated in the array 400 in FIG. 4.

Power meters can determine instantaneous power consumption at a rate of one measurement per 0.1 second. In one embodiment of the present invention the power consumption measurement takes place at a higher rate than the switching rate of a PLC, at least by a factor 10. Assuming that non-controlled devices are switched on or off in a almost random fashion, then most of that on-off switching of uncontrolled devices will take place between on/off switching of the PLC or control computer controlled devices. This allows for a better determination of the uncontrolled power consumption as a background consumption.

Furthermore in many cases, the uncontrolled devices are relatively low power consumers, up to 1 or 2 kW, while the controlled devices may form a load of around 10 kW or higher. This allows for an adjustment of the power consumption of randomly connected/disconnected uncontrolled devices during the times that no controlled device is switched on or off.

The measured power consumption data, corrected for power consumption by uncontrolled devices, and if needed further corrected by known techniques to determine the individual power consumption of a device or of a device group controlled by a control computer.

It is noted that the switching on and off of uncontrolled devices is called random and is meant to indicate a level of uncertainty. While there may be a level of predictability, a high level of uncertainty remains. For instance, 100 employees may enter a facility with a period of 9 am to 10 am. There is a high probability of 95% that at least 70% of the employees will enter their workplace and start working on their computer. There is however a high uncertainty, at least 50%, if an employee will switch on a computer in a period between 9.10 am and 9.11 am. In that period also light may be switched on, a printer may be started. The power consumption of uncontrolled devices may be described by a probability distribution. That allows to perform some statistical analysis and regression analysis. Random in that sense is defined as correctly determining a switching on or off of a device within a period of 1 minute with a probability that is less than 50%, or less than 10%.

Several approaches exist to disaggregate power consumption data collected over a period of time, to attempt to determine individual loads and the individual devices associated with it. This, in general, requires to create a library of characteristics, for instance in time of operation related to a device, period of operation related to a device, amount of consumption related to a device, waveforms and type of power, such as reactive or resistive power consumption and the like. After operation for a certain period, the changes in power consumption, collected by a power meter, sometimes assisted by additional sensors, the disaggregated power consumptions are associated with objects or devices in the library, usually with the help of mathematical matching techniques. LoadIQ of Reno, Nev. provides methods and apparatus that disaggregate power consumption to individual devices. However, the devices in such power meters are unnamed and may be considered unnamed or "logic devices."

In accordance with an aspect of the present invention a networked "intelligent" or "smart" power meter is provided that learns disaggregated power consumption of individual devices as well as of groups of devices and which provides the data of the disaggregated power consumption over the network to the server.

In accordance with an aspect of the present invention the "unnamed" device of the power meter is being identified by using data generated by a control computer or PLC.

One approach is to use output from a Smart Meter and try to create signatures of power consuming devices. The Smart meter may be provided with a processor and memory as well as connection to a network and is programmed with software that disaggregates power consumption and is able to provide changes in power consumption as for instance times series of data.

Power disaggregating methods have proven to be insufficient in a manufacturing environment wherein several different machines may have similar characteristics that make it hard or even completely impossible to properly assign the disaggregated power consumptions to specific loads or devices. In fact, only the direct and unambiguous knowledge of an operational status of a machine being switched on or off or switched in a different state provided by a PLC or control computer, allows a reliable assignment and labeling of a machine with its actual load or the labeling of a disaggregated load with the machine or group of machines to which it pertains. Thus, while some disaggregation of power consumption data recorded by a power meter by mathematical analysis into entities representing a power load is possible, it is not satisfactory or even possible to assign specific power loads or consumption disaggregated by only mathematical techniques and behavior libraries to individual machines or devices in a manufacturing or shop floor with a plurality of devices without having a capability to monitor a state change of the devices through a control computer such as a PLC.

In one embodiment of the present invention, data reflecting changes in power consumption by machinery or other loads, are provided by a processor based power meter configured to disaggregate power use and provide data that represents an amount in power change when a load is switched on or off. This means that server 14 in FIG. 1 does not have to do the power change analysis. That tasks has already been performed by the (smart) power meter 16.

Server 14 receives at least data that is time stamped, that indicates which load or machine is switched on or off by a PLC. Server 14 may receive a message initiated by a PLC that provides a time, the name or ID of the PLC, the name or ID of the load that is switched and an indication of the action, such as switched on, switched off, change of load. The server is configured to map or to associate the power changes with specific loads.

Loads detected by the power meter can only be characterized electrically (i.e. real power consumption, reactive power, timestamps of state change). For instance it can be marked or labeled as the consumption of an individual device. However, the Meter cannot associate the disaggregated power consumption with a specific machine on the factory floor and can therefore not be appropriately labeled. The definitive association with a detected electric load with a physical machine (or machines) on the factory floor takes place in server 14, which receives data from the PLCs on for instance status change and from the (time stamped) disaggregated power consumption from the power meter.

The server is also configured to resolve uncertainties and conflicts. For instance a first device may be switched on and off independently. A second device is sometimes switched on or off concurrently with the first device. Without data from the PLCs or control computers that control these devices it may appear that the second device has a higher power than it actually has. The server, by associating identified devices with the measured and disaggregated power consumption, is configured to determine the actual power consumption of individual machines.

In one embodiment of the present invention, all PLC or control computer controlled devices are monitored by a dedicated power measurement device, either as a group or individually and the power consumption of a total facility is monitored by an overall power consumption measurement system. This provides for a faster and more accurate determination of individual loads on a PLC or control computer.

In accordance with an aspect of the present invention, a power consumption is determined by a power meter at regular intervals and recorded at a server. A recorded power consumption is associated with an occurrence of the switching on or off of one or more devices, controlled by a control computer. A power consumption differential of the power consumption before the occurrence of the switching event and the power consumption after the switching event is calculated and associated with the switching event. A plurality of such occurrences is monitored and recorded and a minimum power consumption is determined from the plurality of recording, thus eliminating or minimizing the effect of unrecorded switching of other devices.

The need for PLC output status data becomes clear as soon as one has a facility with at least two motors. However, the herein provided approach already is beneficial if only one industrial device with an electrical motor method is applied in the facility. In accordance with an aspect of the present invention, the methods provided herein are applied to a facility with a measured power consumption and at least one motor controlled by a control computer.

In accordance with a further aspect of the present invention, the methods provided herein are applied to a facility with a measured power consumption and at least two motors controlled by a control computer. In accordance with a further aspect of the present invention, the methods provided herein are applied to a facility with a measured power consumption and at least five motors controlled by a control computer. In accordance with a further aspect of the present invention, the methods provided herein are applied to a facility with a measured power consumption and at least ten motors controlled by a control computer.

A motor can be applied for transportation, for driving or operating a tool, in a robot arm, for refrigeration, for lifting, for moving an object or for any other purpose in a production facility wherein the use of a motor is beneficial.

It becomes very difficult to distinguish motors or devices from each other without PLC or control computer output when motors or devices have similar ratings, and are used at a similar rate and at similar times.

In one embodiment of the present invention, the server receives data identifying power consumption of disaggregated "unnamed devices" from an intelligent power meter and "named devices" status data from control computers or PLCs. The data preferably are time stamped. In the simplest form, the intelligent power meter alerts the server that an unnamed device x with power consumption y has been switched on at a moment t1. The server also receives data from a PLC that at time t1 Machine_1 has been switched on. If at time t1 and a significant interval around t1 only Machine_1 has been switched on, the server associates the unnamed device 'x' with Machine_1.

The above steps are repeated for additional devices that are switched on.

In a further embodiment of the present invention, data is sent from the power meter to the server when a device is switched off. Data is also sent by the PLC to the server when a status of a known machine is modified from switched-on to switched-off. The server is configured to associate the switched off power with a particular device. This provides the server with an additional way to associate a power with a specific device. It also allows the server to determine individual power consumptions from devices that are switched on at the same time but are switched off at different times.

In one embodiment of the present invention, multiple devices may be switched on and switched off in different combinations at different times. Because an intelligent power meter does not have the capability to identify individual devices by name, it is sometimes not possible for the intelligent meter to even indicate individual unnamed devices. The meter in such a case can only indicate that a certain power amount has been switched on or switched off. With sufficient variation in status change of switched-on and switched-off devices, the server can be configured to place group powers and individual devices in a group in a set of linear equations that can be solved by the server to identify the power consumption of individual devices.

In one embodiment of the present invention, a plurality of devices starts concurrently as part of a production line and is switched-off concurrently, preferably by a single PLC or control computer or by two or more PLCs or control computers under control of a supervisory control computer. In that case, the server, for instance after recording concurrent switching-on and off of the devices, will consider the group as a "switched group" with a determined power consumption.

In one embodiment of the present invention, the server generates a report that can be displayed on a display screen and which identifies the devices by name, the related PLC and PLC output ports, the assessed power consumption of each identified device or group of devices. The report also lists unresolved individual devices of which it is impossible to determine individual power consumption.

In one embodiment of the present invention, a user interactively assigns a power consumption to a device. If the individual power device is assigned to a group, the server will test if the manually assigned power consumption is valid and consistent with pre-entered conditional power values and with the total power consumption of a group of devices. If the assigned power consumption is not considered to be valid an alert is generated by the server, for instance on the screen.

In one embodiment of the present invention, the server is configured to control the control computers or PLCs and is programmed with a routine that switches on and off groups of devices and individual devices that causes a change in power consumption and data generated by the power meter concurrent with the switching of the PLCs that allows the determination of the individual power consumption of a device or group of devices. The routine is structured in a way that only devices are switched on and off in a way that no damage occurs and that is allowed within a structure of a production facility.

In one embodiment of the present invention a device has a plurality of operational stages, for instance related to different speeds of a motor. An intelligent power meter may not be able to disaggregate different power consumptions of a device at different times and may consider the different power consumptions to be associated with different "unnamed" devices. By using the output data of the PLC and the power meter output, the server decides that a device has different power consumptions.

Figure 5:
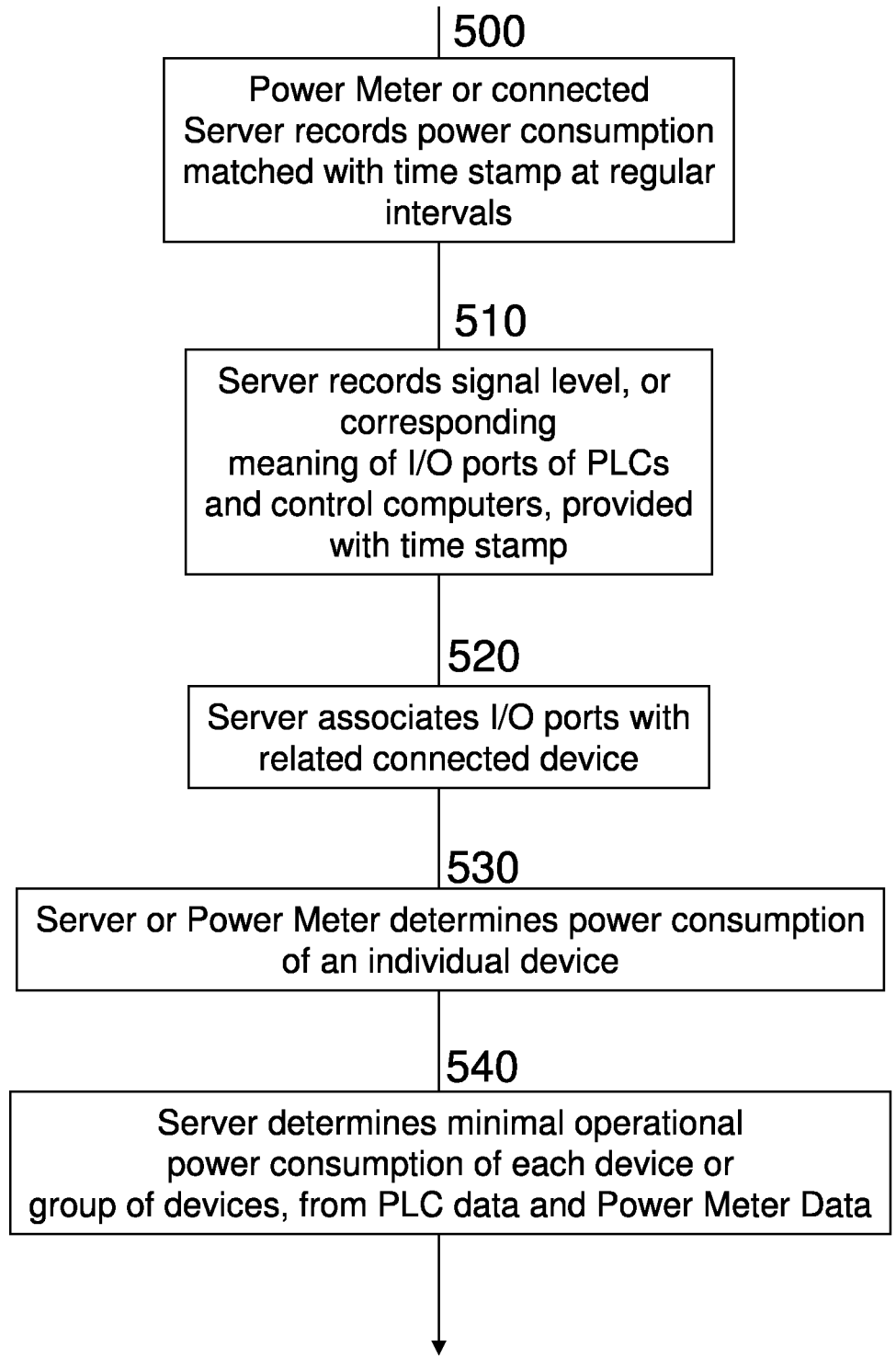
FIG. 5 illustrates steps performed by a configured processor in accordance with various aspects of the present invention.

Steps of the process in the herein provided approach are illustrated in FIG. 5. In step 500 a power meter provides power consumption data of for instance a facility. This may be instantaneous or semi-instantaneous power consumption data over periods ranging from 0.1 sec to 10 sec. to 30 sec. Power consumption measurement over longer periods may also be applied, but may lead to inaccuracies in device detection. The power meter is configured to measure real (or resistive) power, as well as reactive power.

In a further embodiment of the present invention, recording of power consumption measurement may also take place based on detected switching events. For instance at the moment of detection and 1-10 seconds after switching. Recording of power consumption by the server may also be based on detection of power consumption change, provided with a time stamp. This may limit the amount of data that needs to be stored.

In step 510, the server records a switching event. The physical event is an output change, for instance from 0 to 24V, at an output of an I/O channel of a control computer. The change of output levels may indicate intermediate changes. The server can record a switching event (event takes place, by changing of output level) en determine from the changing power consumption what the event is. An increase in power consumption means a device is switched on. A decrease means the device is switched off. An I/O channel is associated at the server with a device. For instance: change in I/O channel 1 output, means a motor A is affected.

In one embodiment of the present invention a message is created related to a change of an I/O port, indicating an identifier of the I/O port and a status indicator, including a time stamp. The above is an example of notifying the server of a status change of an I/O output on a PLC or control computer. Other ways to provide the server with a status report on an I/O output of a control computer are possible and are fully contemplated.

In step 520, an I/O port is associated with a specific named device, to make it easier for a user to see which physical device is switched on or off. A simple translation table at the server can fulfill such a role.

In step 530, the server determines a power consumption differential between the time the I/O port changes status and at a time before (for instance right before) the status change. In accordance with a further aspect of the present invention, power consumption may be recorded from the time a status is being changed to the time a device achieves a steady power consumption level. It is well known that the switching on of electromechanical devices may cause a power surge created by start-up phenomena such as inrush currents.

In general, if different devices are not switched on at the same time, the start-up power consumption may be ignored as being relevant for overall power consumption as steady-state power consumption of a device may be significantly lower than start-up consumption. However, if the power consumption of a device is recorded right at start-up, it may provide a distorted view of the overall power consumption.

In some cases, if too many devices are switched on at the same time, a drop in voltage may be experienced in the facility, and even circuit breakers may be tripped. In the alternative, to prevent start-up problems, one may install, what is known in the art, as 'soft' or gradual start-up. Herein, a motor is started by gradually increasing the power consumption. This may create, in the context of aspects of the present inventions, the problem that actual power consumption determined for such a 'soft' started device is too low.

In accordance with an aspect of the present invention, start-up behavior of a device is made part of its description. This can be expressed as a mandatory delay for the server to record a 'final' power consumption differential after start-up of the device. The mandatory delay reflects the required time for a device to reach steady state after start-up. The server can also be instructed to determine power consumption at the time of start-up and at short consecutive intervals. This allows the server to determine for each device the delay time required to reach steady state of a machine, if it is not provided to the server by other means. This forms an intermediate step by the server, before actual power consumption of a device is determined.

In step 540, the server determines a minimal operational power consumption of each device or group of devices, running in a steady state mode.

In accordance with an aspect of the present invention, the server also determines a maximum power consumption of each device during start-up. The server may be instructed to do the same analysis for switch-off, motor braking, motor reversal, motor speed regulation and the engagement of loads to a motor.

In accordance with an aspect of the present invention, the herein provided approach and steps are applied to buildings or homes where Home Automation Controllers (HAC) are used to control lighting, ventilation, and appliances. In that case, the outputs of all HACS are read and based on these output signals and the fixtures and appliances identification data, a plot showing which fixture or appliance is being turned on and off over time is derived. By overlaying this plot on top of the electric loads state change over time plot, a processor is configured to associate the power consumption characteristics of the individual loads or load clusters with the individual fixtures, appliance, or clusters.

In accordance with an aspect of the present invention, the data generated in accordance with various aspects of the present invention to determine a power consumption of a device, are applied to a scheduling program on the server. Each device or group of devices is provided with a priority rating and an expected duration rating. For instance a rating 1, 2, 3 may be provided. Rating 1 meaning priority over all others to start; rating 2 meaning, a higher priority than rating 3; and rating 3 meaning a lowest priority. There may also be a shut-down priority. A shut down priority may have two levels: shut down priority 1 means that once started the process must be completed before it can be shut down. Shut down priority 2 means that the process can be shut down any time. Different priorities are possible as the above priorities are mere illustrative examples.

An expected duration delay is the expected time to shut down a process. For instance, a process may have several devices acting consecutively on a product in a processing line. It may be undesirable to leave a product stuck unprocessed in a processing line. This means that a shut down of a processing line will require consecutive shut down of devices as the last product works its way through the processing line.

In one embodiment of the present invention a scheduling and optimization program is installed on the server. The programs generates a schedule expressed in PLC programs or control computer programs to control the devices in a facility. A scheduling/optimization programs generates a schedule under preset conditions and defined constraints. In general, with unlimited power and resources availability, a scheduling program generates a schedule that optimizes a facility production output. One scheduling constraint may be that the number of starting devices at a certain moment will not exceed a limit that will trip a circuit breaker. The scheduler will make sure that unrelated processes are scheduled with sufficient delay.

In accordance with an aspect of the present invention, a consumer can view and select a suggested schedule, and have the HAC execute the selected schedule for switching on or off selected devices which can be managed by the HAC system.

Figure 6:
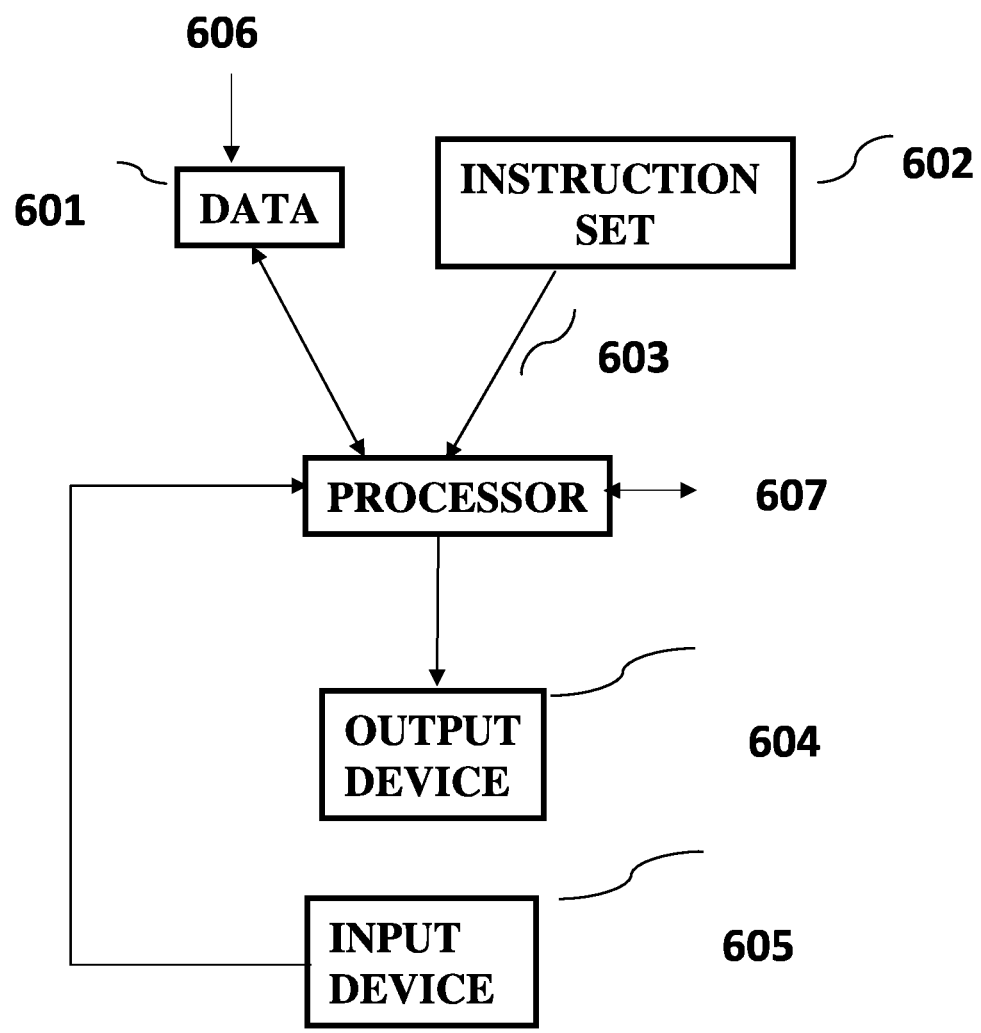
FIG. 6 illustrates a processor based system in accordance with various aspects of the present invention.

The methods as provided herein are, in one embodiment of the present invention, implemented on a networked system or computer device. Thus, steps described herein are implemented on a processor in a system, as shown in FIG. 6. A system illustrated in FIG. 6 and as provided herein is enabled to receive, process and generate data. The system is provided with data that can be stored on a memory 601. Data may be obtained from an input device. Data may be provided on an input 606. Such data is preferably provided by a control computer or a PLC via a network, or by sensors in the building or on a device or from a data base or any other source that collects and stores a device status and power meter data.

The processor is also provided or programmed with an instruction set or program executing the methods of the present invention that is stored on a memory 602 and is provided to the processor 603, which executes the instructions of 602 to process the data from 601. Data provided by the processor can be signals designated for a network address of a port to connect or to disconnect a device to or from power. Data provided by the processor can also be outputted on an output device 604, which may be a display to display images or data or a data storage device. The processor also has a communication channel 607 to receive external data from a communication device and to transmit data to an external device, for instance to a central SCADA system. The system in one embodiment of the present invention has an input device 605, which may include a keyboard, a mouse, a pointing device, or any other device that can generate data to be provided to processor 603.

The processor can be dedicated or application specific hardware or circuitry. However, the processor can also be a general CPU or any other computing device that can execute the instructions of 602. Accordingly, the system as illustrated in FIG. 6 provides a system for processing data and is enabled to execute the steps of the methods as provided herein in accordance with one or more aspects of the present invention.

While there have been shown, described and pointed out fundamental novel features of the invention as applied to preferred embodiments thereof, it will be understood that various omissions and substitutions and changes in the form and details of the methods and systems illustrated and in its operation may be made by those skilled in the art without departing from the spirit of the invention. It is the intention, therefore, to be limited only as indicated by the claims.

The invention claimed is:

1. A system to determine a power consumption of each of a plurality of devices in a power circuit, comprising:
   a first programmable logic controller (PLC) including at least one control output configured to control an operational status of a first device in the plurality of devices connected to the power circuit;
   a network including a power meter configured to measure and provide a first individual electric power consumption from a total electric power consumption in the power circuit;
   a server connected by the network to the first PLC and configured to receive data from the first PLC that determines the operational status of the first device;
   wherein the power meter is enabled to transmit data representing the first individual electric power consumption to the server, and
   wherein the server is configured to determine a power consumption of the first device by associating the operational status of the first device with the first individual electric power consumption, the power consumption of the first device being determined based upon switching events of the first device by the first PLC.

2. The system of claim 1, wherein each of the plurality of devices is controlled by a Programmable Logic Device (PLC).

3. The system of claim 2, wherein each PLC is connected to the server by the network.

4. The system of claim 1, wherein an operational status of each of the devices in the plurality of devices is monitored by the server and a power consumption of each of the devices in the plurality of devices is determined by the server based on data provided by the power meter.

5. The system of claim 1, wherein a power consumption by a further plurality of devices in the power circuit changes over time in a random manner.

6. The system of claim 1,
   wherein the server is configured to execute instructions to schedule an activation of the first device by the first PLC based on the power consumption of the first device.

7. The system of claim 1, further comprising a user interface of the server which is configured to interactively assign a power consumption to a second device.

8. The system of claim 1, wherein the server is configured to instruct a Programmable Logic Controller (PLC) to switch-on a second device to assign a power consumption to the second device based on data generated by the power meter.

9. A method for determining a power consumption of each of a plurality of devices in a power circuit, comprising:
   a power meter in a network measuring and providing a first individual electric power consumption from a total electric power consumption in the power circuit;

a first programmable logic controller (PLC) including at least one control output, controlling an operational status of a first device in the plurality of devices that is connected to the power circuit;

a server connected by the network to the first PLC receiving data from the first PLC that determines the operational status of the first device;

the power meter transmitting time stamped data representing the first individual electric power consumption to the server; and the server determining a power consumption of the first device by associating the operational status of the first device with the first individual electric power consumption, the electric power consumption of the first device being determined based upon a switching event of the first device by the first PLC.

10. The method of claim 9, wherein each of the plurality of devices is controlled by a Programmable Logic Device (PLC).

11. The method of claim 10, wherein each PLC is connected to the server by the network.

12. The method of claim 9, wherein an operational status of each of the devices in the plurality of devices is monitored by the server and a power consumption of each of the devices in the plurality of devices is determined by the server based on data provided by the power meter.

13. The method of claim 9, wherein a power consumption by a further plurality of devices in the power circuit changes over time in a random manner.

14. The method of claim 9, further comprising:
the server executing instructions to schedule an activation of the first device by the first PLC based on the power consumption of the first device.

15. The method of claim 9, further comprising assigning interactively via a user interface of the server a power consumption to a second device.

16. The method of claim 9, wherein the server is configured to instruct a Programmable Logic Controller (PLC) to switch-on a second device to assign a power consumption to the second device based on data generated by the power meter.

17. The system of claim 1, wherein the power consumption of the first device is determined based upon switching on or off the first device by the first PLC.

18. The system of claim 1, wherein the power meter is configured to measure resistive and/or reactive electric power.

19. The method of claim 9, wherein the power consumption of the first device is determined based upon switching on or off the first device by the first PLC.

20. The method of claim 9, wherein the power meter is configured to measure resistive and/or reactive electric power.

* * * * *